(12) United States Patent
Yamamoto et al.

(10) Patent No.: US 7,554,158 B2
(45) Date of Patent: Jun. 30, 2009

(54) SEMICONDUCTOR DEVICE HAVING ANALOG AND DIGITAL CIRCUITS

(75) Inventors: Ryota Yamamoto, Kanagawa (JP); Kuniko Kikuta, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 526 days.

(21) Appl. No.: 11/338,641

(22) Filed: Jan. 25, 2006

(65) Prior Publication Data
US 2006/0180871 A1    Aug. 17, 2006

(30) Foreign Application Priority Data
Feb. 17, 2005    (JP) .............................. 2005-040499

(51) Int. Cl.
*H01L 29/76*    (2006.01)
(52) U.S. Cl. ...................... 257/357; 257/355; 257/356; 257/E21.632; 257/E27.064
(58) Field of Classification Search ................... 257/36, 257/355, 356, 357, 369, 376
See application file for complete search history.

(56) References Cited

U.S. PATENT DOCUMENTS 5,559,356 A * 9/1996 Yukawa ....................... 257/371
5,994,741 A * 11/1999 Koizumi et al. .............. 257/355
6,911,700 B2 * 6/2005 Okamoto ..................... 257/355
7,176,530 B1 * 2/2007 Bulucea et al. ............. 257/369
2004/0056314 A1 * 3/2004 Ohguro ....................... 257/371

FOREIGN PATENT DOCUMENTS

| JP | 6-69436 | 3/1994 |
| JP | 6-163823 | 6/1994 |

* cited by examiner

*Primary Examiner*—Fernando L Toledo
(74) *Attorney, Agent, or Firm*—Young & Thompson

(57) ABSTRACT

An N-type deep well is used to protect a circuit from a noise. However, a noise with a high frequency propagates through the N-type deep well, and as a result, the circuit that should be protected malfunctions. To reduce the area of the N-type deep well. For instance, in the present invention, a semiconductor device comprises a semiconductor substrate of a first conductivity type, a digital circuit part and an analog circuit part provided on the semiconductor substrate, a plurality of wells of the first conductivity type formed in either the analog circuit part or the digital circuit part, and a first deep well of a second conductivity type, which is the opposite conductivity type to the first conductivity type, isolating some of the plurality of wells from the semiconductor substrate.

11 Claims, 6 Drawing Sheets

SEMICONDUCTOR DEVICE HAVING ANALOG AND DIGITAL CIRCUITS

FIELD OF THE INVENTION

The present invention relates to a semiconductor device and particularly a semiconductor device having a digital circuit part and an analog circuit part on one substrate.

BACKGROUND OF THE INVENTION

In order to reduce the size of a semiconductor device and achieve high functionality, a semiconductor device having a digital circuit and an analog circuit on one semiconductor substrate has been developed.

In such a semiconductor device, there is a problem that a noise that occurs in the digital or analog circuit propagates through the substrate and influences other circuits. Especially, the noise emitted by the digital circuit propagating to the analog circuit through the substrate, and causing the analog circuit to malfunction can be a big problem.

Technologies to solve this problem are disclosed in Patent Documents 1 and 2.

In the technology disclosed in Patent Document 1, a deep well of the opposite conductivity type to a semiconductor substrate isolates the whole analog circuit part or the whole digital circuit part from the semiconductor substrate.

Hereinafter, explanations will be made assuming the conductivity type of a semiconductor substrate is P-type, however, it may be N-type. In that case, the conductivity type of all the constituent elements will be reversed.

For instance, referring to FIG. 1 of Patent-Document 1, an analog circuit part formed on a P-type semiconductor substrate 10 is isolated from the semiconductor substrate by an N-type deep well 12. Further, a digital circuit part is surrounded by an N-type deep well 14.

In the technology disclosed in Patent-Document 2, in an analog circuit part, a well of the same conductivity type as a semiconductor substrate is surrounded by a deep well of the opposite conductivity type to the semiconductor substrate.

For instance, referring to FIG. 1 of Patent-Document 2, a P-type well 4 in an analog circuit part formed on a P-type semiconductor substrate 1 is isolated from the semiconductor substrate 1 by an N-type deep well 4.

In these technologies, depletion layers formed between the semiconductor substrates and deep wells prevent the propagation of noise.

[Patent Document 1] Japanese Patent Kokai Publication No. JP-A06-163823

[Patent Document 2] Japanese Patent Kokai Publication No. JP-A06-69436

SUMMARY OF THE DISCLOSURE

The present inventors have discovered the above-mentioned prior arts have the following problems.

As shown in FIG. 6, when an N-type deep well 30 is formed on a P-type semiconductor substrate 1, a depletion layer is formed between the two. Then a parasitic capacitance Cp occurs with the deep well 30 and the semiconductor substrate 1 as its electrodes and the depletion layer as its dielectric body. Note that the symbol of the capacitance shown in FIG. 6 is a virtual one. And a noise from the semiconductor substrate 1 propagates into the region that the deep well is supposed to isolate via the parasitic capacitance C.

An impedance Z of this parasitic capacitance for the noise propagating through a path P shown in FIG. 6 is proportional to $1/(\omega C)$. Here, the frequency of the noise is $\omega$, and the capacitance value of the parasitic capacitance Cp is C. In other words, the higher the frequency of the noise gets, the easier the noise propagates via the parasitic capacitance caused by the deep well.

In general, a noise contains various frequency components. Because of this, a high frequency noise has conventionally propagated into a region isolated by a deep well via a parasitic capacitance. However, since the clock frequency of a conventional semiconductor device was so low that a noise with a frequency high enough to propagate via a parasitic capacitance did not influence the semiconductor device.

However, the clock frequencies of the latest semiconductor devices have been increased greatly, and as a result, high frequency noises that propagate via parasitic capacitances have come to influence these semiconductor devices.

The point of the present invention is to reduce the area of a deep well that isolates a well of the opposite conductivity type to a semiconductor substrate from the semiconductor substrate. When a large area is need to be isolated by the deep well, a plurality of deep wells isolated and independent from each other are used and the area of each deep well can be made small.

By doing the above, the capacitance value of the parasitic capacitance that occurs between the semiconductor substrate and deep well becomes low. Then, the impedance of the parasitic capacitance for a noise becomes high, reducing the propagation of noise.

For instance, a semiconductor device relating to a first aspect of the present invention comprises: a semiconductor substrate of a first conductivity type; a digital circuit part and an analog circuit part provided on the semiconductor substrate; a plurality of wells of the first conductivity type formed in either the analog circuit part or the digital circuit part; and a first deep well of a second conductivity type, which is the opposite conductivity type to the first conductivity type, isolating some of the plurality of wells from the semiconductor substrate.

Further, another semiconductor device relating to a second aspect of the present invention comprises: a semiconductor substrate of a first conductivity type; a digital circuit part and an analog circuit part provided on the semiconductor substrate; and a plurality of deep wells of a second conductivity type, which is the opposite conductivity type to the first conductivity type, formed in either the analog circuit part or the digital circuit part, said a plurality of deep wells being isolated and independent from each other.

The meritorious effects of the present invention are summarized as follows.

According to the present invention, the capacitance value of a parasitic capacitance that occurs between a deep well and a semiconductor substrate can be reduced. Therefore, the impedance of the parasitic capacitance can be made high. As a result, the propagation of noise via the parasitic capacitance can be reduced.

BRIEF DESCRIPTIONS OF THE DRAWINGS

PREFERRED EMBODIMENTS OF THE INVENTION

Embodiment 1

Figure 1:
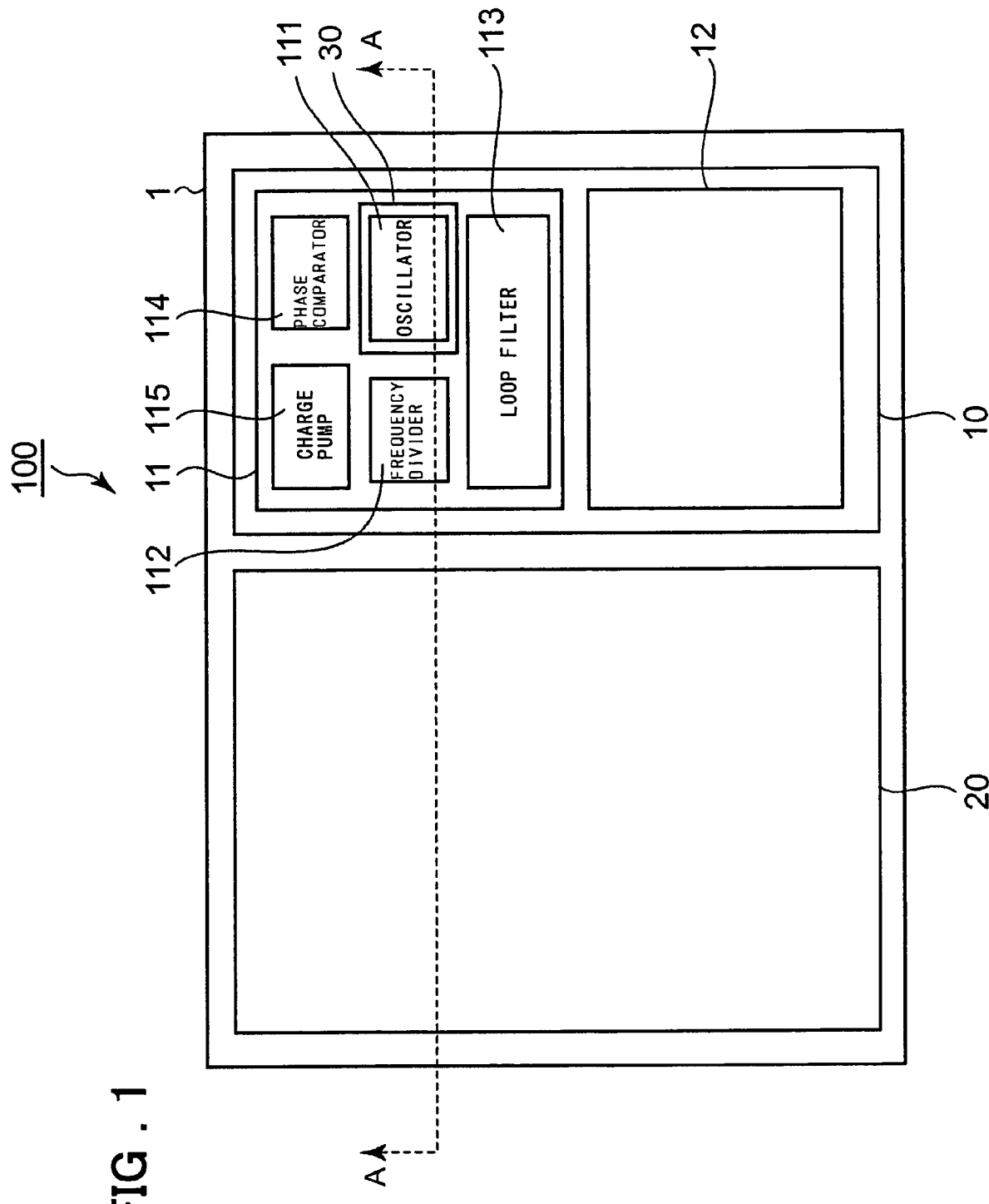
FIG. 1 is a drawing for explaining a first embodiment of the present invention.
Figure 2:
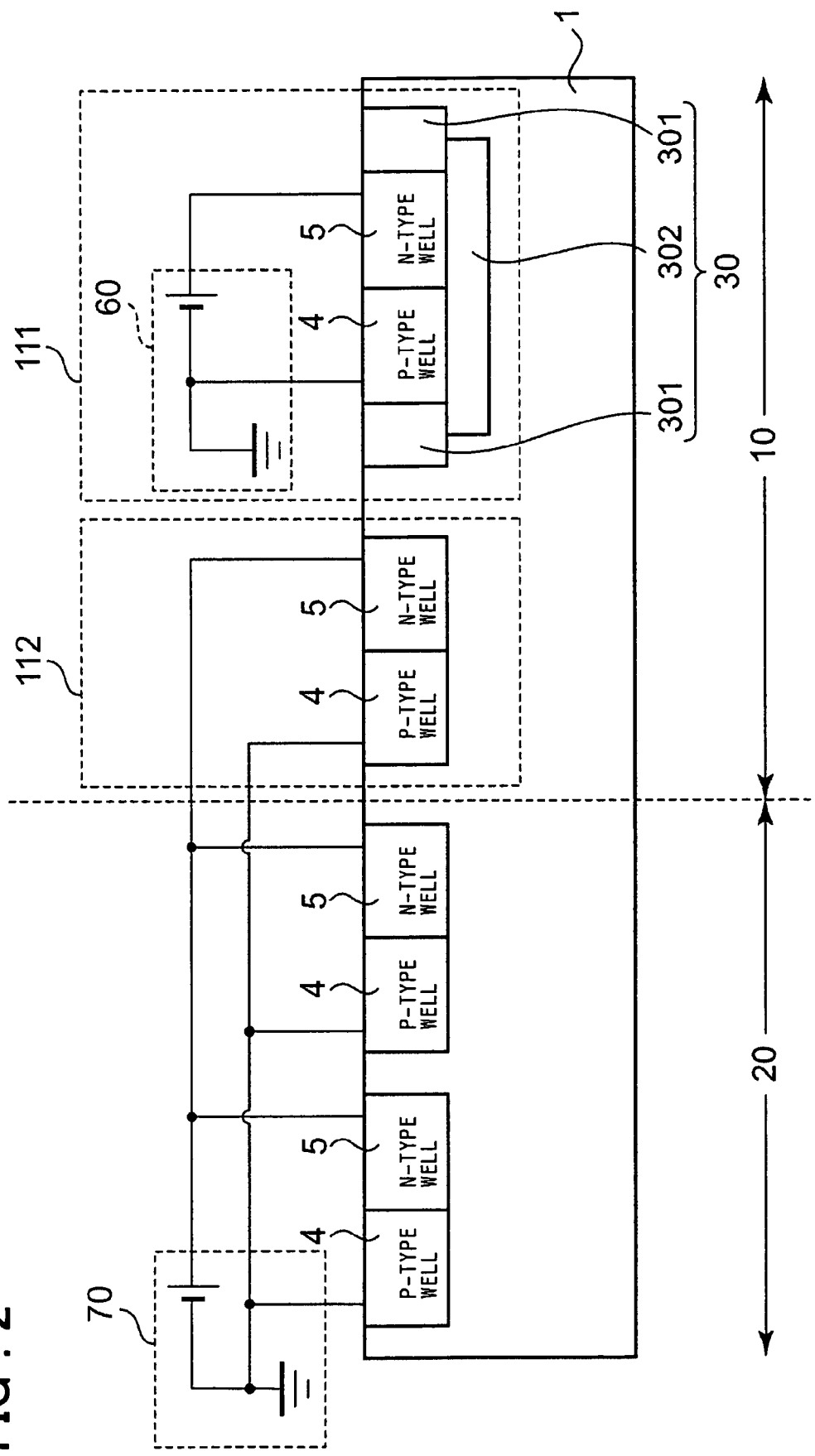
FIG. 2 is a cross section of FIG. 1 for explaining the first embodiment of the present invention.

A first embodiment of the present invention will be described with reference to FIGS. 1 and 2. FIG. 1 is a schematic plan of a semiconductor device 100 relating to the present embodiment. FIG. 2 is a cross sectional view taken along a line A-A in FIG. 1.

Referring to FIG. 1, the semiconductor device 100 comprises a P-type semiconductor substrate 1, and an analog circuit part (or unit) 10 and a digital circuit part (or unit) 20 formed on the semiconductor substrate 1.

The analog circuit part 10 includes a PLL circuit 11 and another circuit 12. The PLL circuit 11 comprises an oscillator 111, a frequency-divider 112, a loop filter 113, a phase comparator 114, and a charge pump 115.

Within the PLL circuit, a circuit constituting the oscillator 111, which is susceptible to noise, is isolated from the P-type semiconductor substrate 1 by an N-type deep well 30. Being "isolated" here means that it is electrically isolated by a depletion layer formed between the N-type deep well 30 and the P-type semiconductor substrate 1.

The semiconductor device 100 is further described in detail with reference to FIG. 2.

In order to constitute a CMOS circuit, a plurality of P-type wells 4 and a plurality of N-type wells 5 are formed on the semiconductor substrate 1. Inside the P-type wells 4 and the N-type wells 5, MOSFETs for constituting desired circuits are formed, respectively (not shown in the drawing).

Out of the plurality of the P-type wells 4, a P-type well 4 constituting the oscillator 111 is isolated from the semiconductor substrate 1 by the N-type deep well 30. More concretely, the P-type well 4 is isolated from the semiconductor substrate 1 by an N-type well 301 surrounding the P-type well 4 and an N-type deep well 302 formed adjacent to the bottom of the N-type well 301.

Further, a power supply 60 connected to the oscillator circuit 111 is isolated from a power supply 70 connected to other regions. By isolating the power supplies from each other, the propagation of noise can be reduced even more effectively.

Figure 3A:
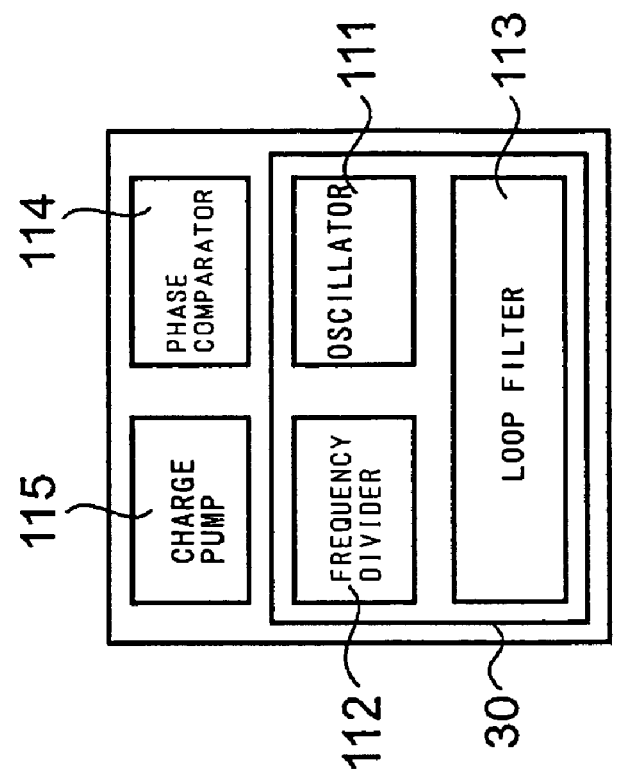
FIGS. 3A and 3B are showing another example of the first embodiment of the present invention.
Figure 3B:
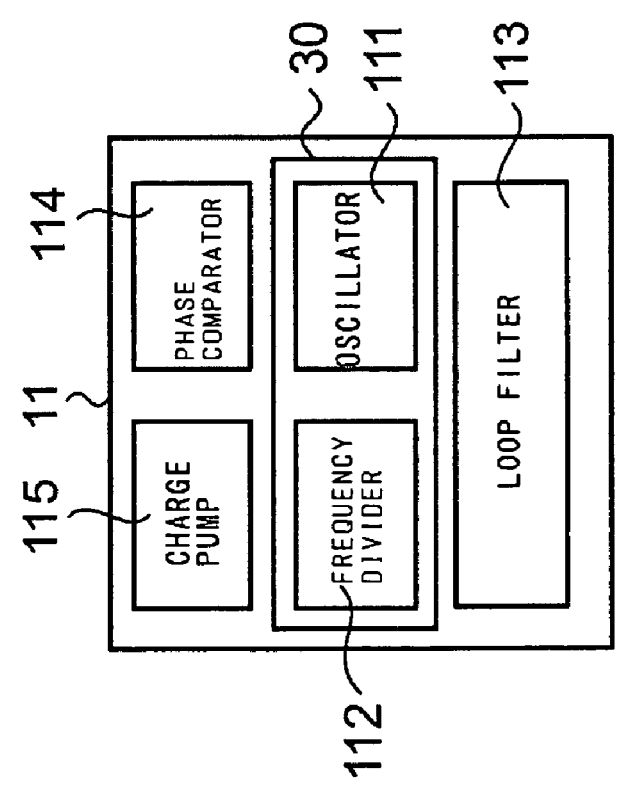

In the present embodiment, the N-type deep well 30 only isolates the circuit constituting the oscillator 111 from the semiconductor substrate 1. However, as shown in FIGS. 3A and 3B, the N-type deep well 30 may be formed so that it isolates the oscillator 111 and the frequency divider 112 (FIG. 3A) or the oscillator 111, the frequency divider 112, and the loop filter 113 (FIG. 3B) from the semiconductor substrate 1.

Embodiment 2

Figure 4:
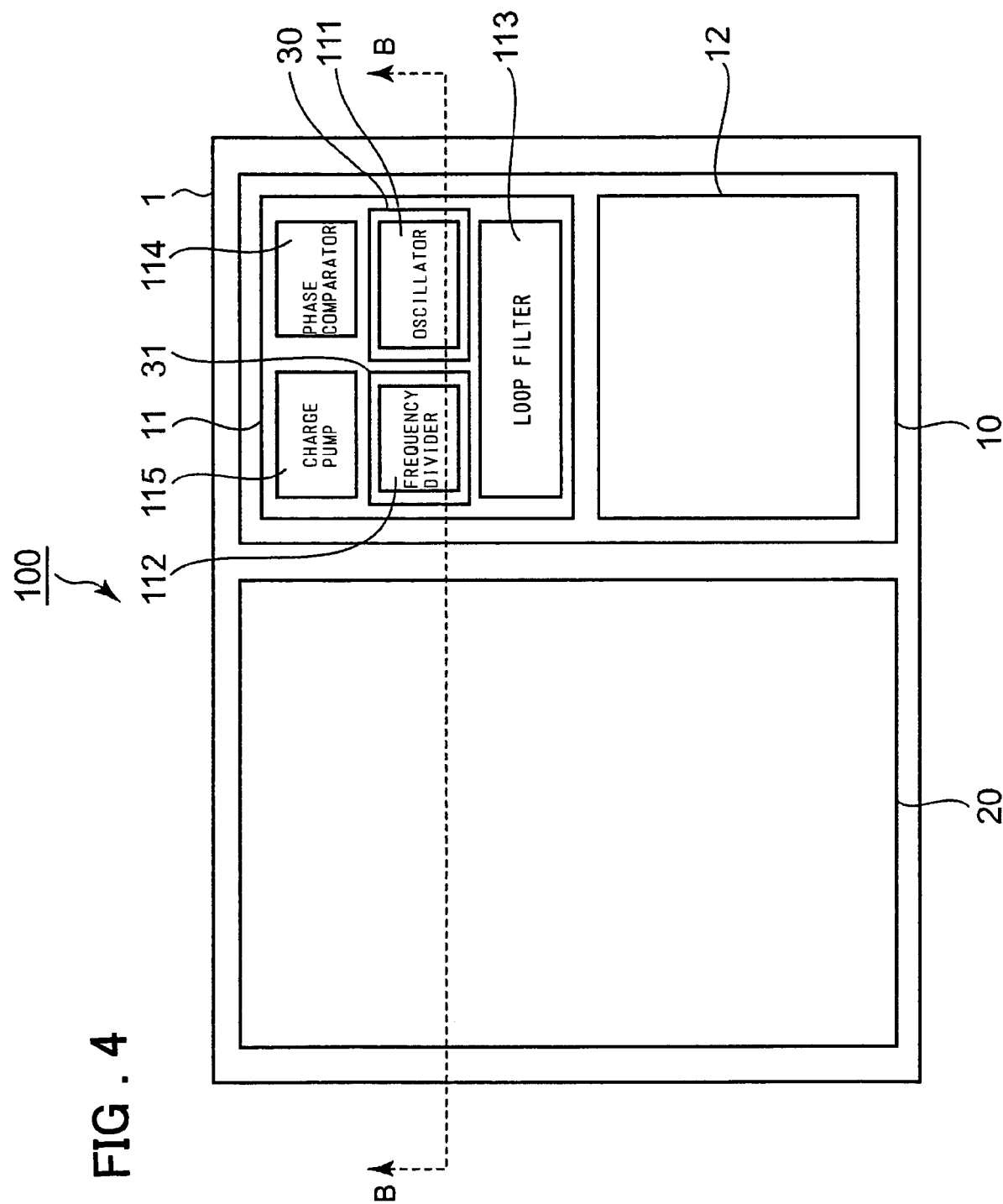
FIG. 4 is a drawing for explaining a second embodiment of the present invention.
Figure 5:
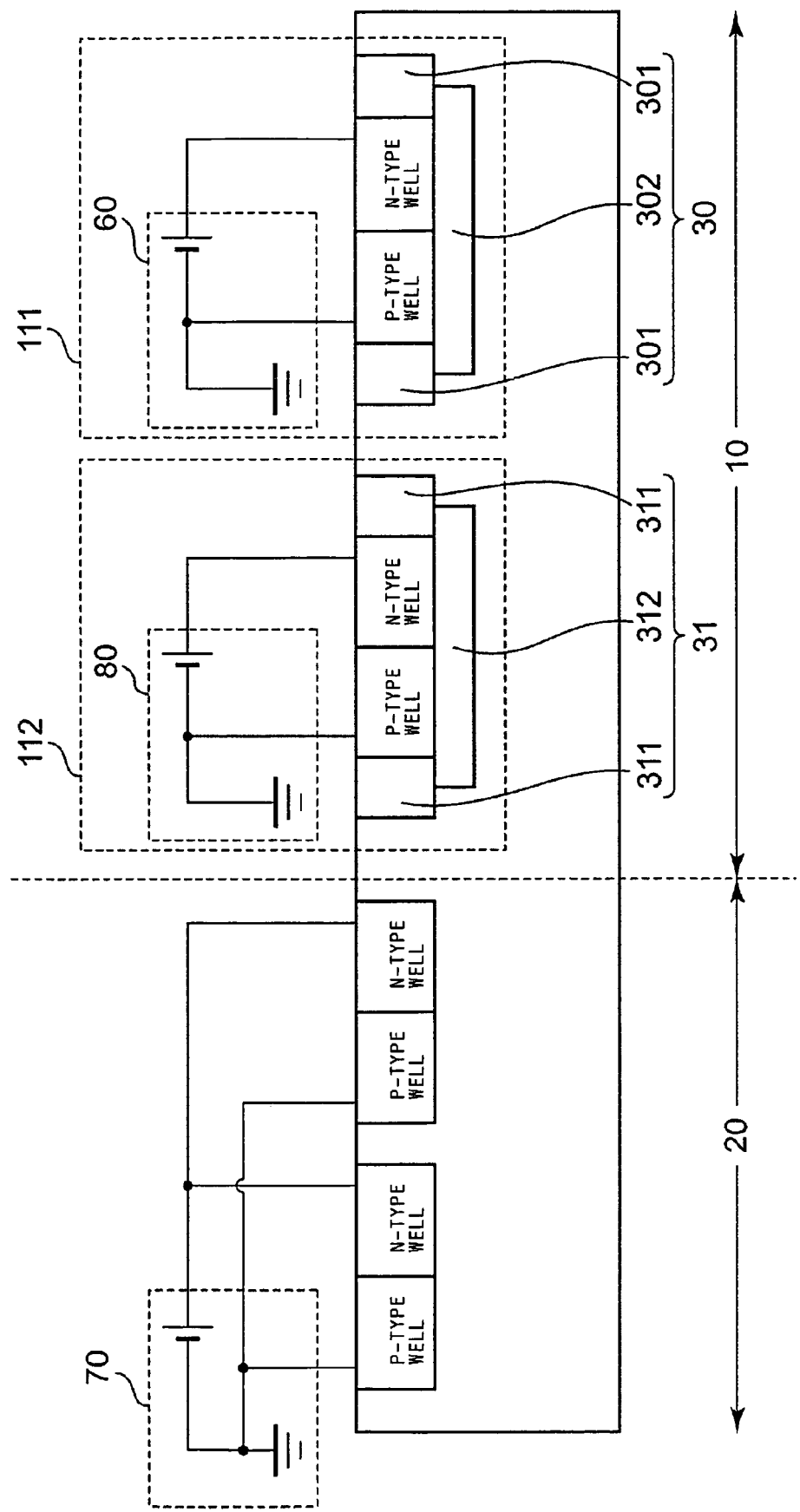
FIG. 5 is a cross section of FIG. 4 for explaining the second embodiment of the present invention.
Figure 6:
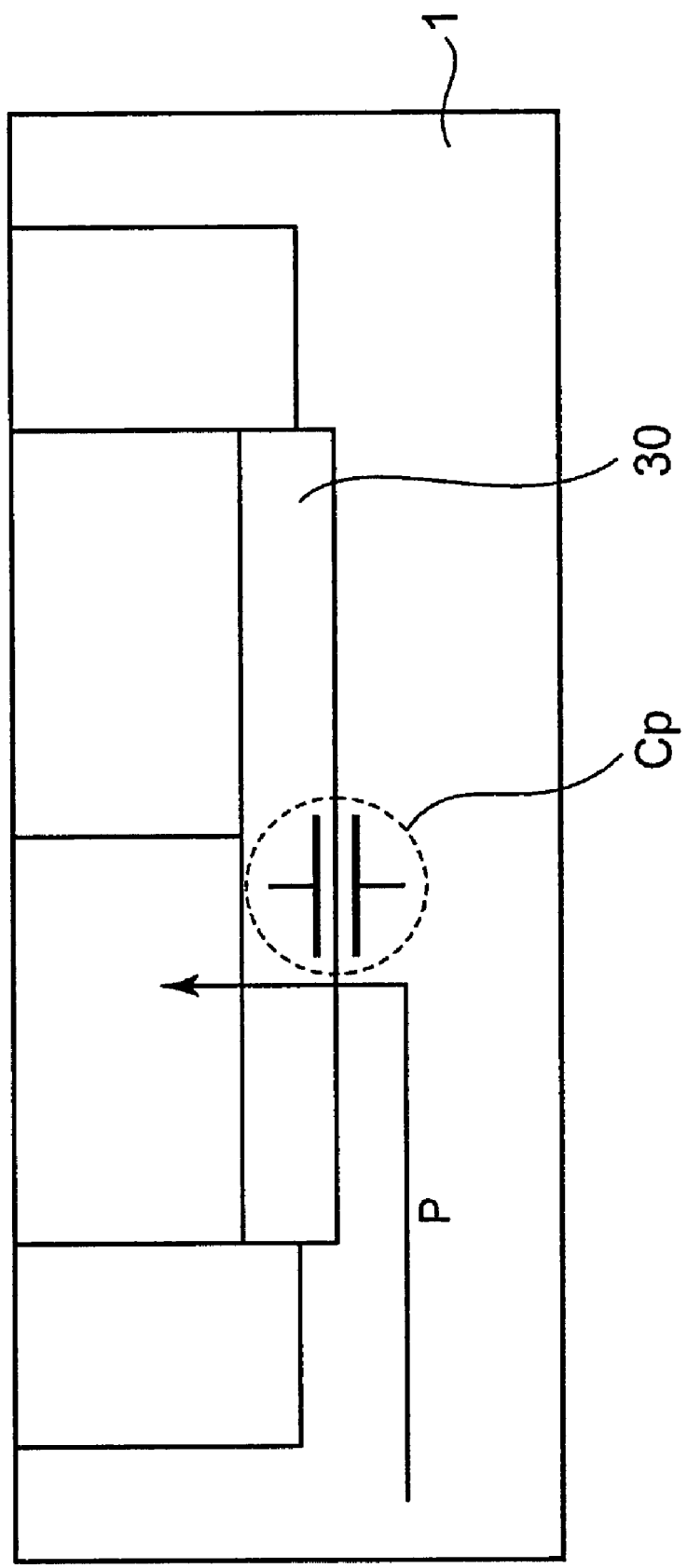
FIG. 6 is a drawing for explaining the problems of the prior arts that the inventor has discovered.

A second embodiment of the present invention will be described with reference to FIGS. 4 and 5. FIG. 4 is a schematic plan of a semiconductor device 100 relating to the present embodiment. FIG. 5 is a cross sectional view taken along a line B-B in FIG. 4.

The difference between the present embodiment and the first embodiment resides in that two N-type deep wells (30, 31) are formed and they are isolated and independent from each other. Here, "being isolated and independent" means that a P-type semiconductor substrate 1 or a P-type well (not shown in the drawings) is interposed between the two N-type deep wells 30 and 31, and the potential of one does not essentially influence that of the other.

In the present embodiment, one of the N-type deep-wells 30 isolates a P-type well 4 constituting an oscillator 111 from the semiconductor substrate 1, and the other N-type deep well 31 isolates a P-type well 4 constituting a frequency divider 112 from the semiconductor substrate 1.

Further, a power supply 60 connected to the oscillator 111 where the N-type deep well 30 is formed, a power supply 80 connected to the frequency divider 112 where the N-type deep well 31 is formed, and a power supply 70 connected to other circuits are isolated from each other.

In the above-mentioned embodiments, the N-type deep wells 30, 31 are applied to the analog circuit part 10, however, the present invention may be applied to the digital circuit part 20. In other words, out of a plurality of P-type wells 4 in the digital circuit part 20, some of the P-type wells 4 may be isolated from the semiconductor substrate 1 by the N-type deep well. Further, each of the plurality of the P-type wells 4 in the digital circuit part 20 may be isolated from the semiconductor substrate 1 by each of a plurality of the N-type deep wells isolated and independent from each other. The same applies to the isolation of the power supplies.

The ratio between the voltage Vin of a noise inputted into a N-type deep well and the voltage Vout of the noise propagating through the N-type deep well is expressed by the following formula.

$$\frac{Vout}{Vin} = \frac{S}{2\pi f} \sqrt{\frac{\varepsilon_{si} \cdot q \cdot Nsub}{2(\phi_{bi} + Vapp)}} \quad \text{[Formula 1]}$$

Note that the area of the N-type deep well is S, the frequency of the noise is f, the dielectric constant of the semiconductor substrate 1 is $\varepsilon_{si}$, the electric charge of the electrons is q, the impurity concentration of the semiconductor substrate 1 is Nsub, the built-in potential is $\phi_{bi}$, and the potential difference between the semiconductor substrate 1 and the N-type deep well is Vapp.

This ratio shows how much noise propagates through the N-type deep well. In other words, when the ratio is 1/2, the noise is reduced in half by the N-type deep well.

According to the formula 1, for instance, in order to reduce a noise with a frequency f by half, the area S of the N-type deep well should be designed so that the right-hand side of the formula 1 is not bigger than 1/2. Further, in order to reduce a noise with a frequency f by 1/10, the area of the N-type deep well should be designed so that the right-hand side of the formula 1 is not bigger than 1/10.

According to the investigation by the present inventor, when the frequency of a noise is 100 MHz, the noise can be reduced by at least 10% if an N-type deep well with an area of smaller than 300000 $\mu m^2$ is used. Further, the noise can be reduced by at least 90% if an N-type deep well with an area of smaller than 1000 $\mu m^2$ is used.

Let's consider the case where the present invention is applied to the protection of a PLL circuit with a clock frequency of X. The PLL circuit is susceptible to a noise with a frequency of approximately 1/10 of the clock frequency X. In order to reduce the noise with a frequency of X/10 by half or 1/10, the area S of an N-type deep well should be set so that the following formula 2 or 3 is satisfied.

$$S < \frac{1}{2} \cdot \frac{2\pi \cdot \left(\frac{X}{10}\right)}{\sqrt{\frac{\varepsilon\, si \cdot q \cdot Nsub}{2(\phi\, bi + Vapp)}}} \quad \text{[Formula 2]}$$

$$S < \frac{1}{10} \cdot \frac{2\pi \cdot \left(\frac{X}{10}\right)}{\sqrt{\frac{\varepsilon\, si \cdot q \cdot Nsub}{2(\phi\, bi + Vapp)}}} \quad \text{[Formula 3]}$$

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
a semiconductor substrate of a first conductivity type;
a digital circuit part and an analog circuit part provided on said semiconductor substrate, wherein at least one of the digital circuit part and the analog circuit part include a plurality of circuit elements;
a plurality of wells of said first conductivity type which correlate to the plurality of circuit elements formed in either said analog circuit part or said digital circuit part; and
a first deep well of a second conductivity type, which is an opposite conductivity type to said first conductivity type, wherein the first deep well isolates less then all of the plurality of circuit elements of at least one of the digital circuit part and the analog circuit part from said semiconductor substrate.

2. The semiconductor device as defined in claim 1 wherein said first deep well has an area smaller than 300000 μm$^2$.

3. The semiconductor device as defined in claim 1 wherein said first deep well has an area smaller than 1000 μm$^2$.

4. The semiconductor device as defined in claim 1 further comprising a second deep well, the second deep well isolating at least one circuit element from the substrate, wherein the first deep well and the second deep well independently isolate different circuit elements in the same circuit part.

5. The semiconductor device as defined in claim 1 wherein a power supply connected to the wells isolated from said semiconductor substrate by said first deep well is isolated from a power supply connected to other wells.

6. A semiconductor device comprising:
a semiconductor substrate of a first conductivity type;
a digital circuit part and an analog circuit part provided on said semiconductor substrate; and
a plurality of deep wells of a second conductivity type, which is an opposite conductivity type to said first conductivity type, formed in either said analog circuit part or said digital circuit part, said deep wells formed in the same circuit part and being isolated and independent from each other.

7. The semiconductor device as defined in claim 6 comprising a plurality of circuit regions isolated from said semiconductor substrate by each of said plurality of deep wells; wherein
power supplies respectively connected to each of said plurality of circuit regions are isolated from each other.

8. The semiconductor device as defined in claim 6 wherein each of said plurality of deep wells has an area smaller than 300000 μm$^2$.

9. The semiconductor device as defined in claim 6 wherein each of said plurality of deep wells has an area smaller than 1000 μm$^2$.

10. The semiconductor device as defined in claim 1 wherein said first deep well isolates said wells constituting a PLL circuit with a clock frequency of X from said semiconductor substrate, and when the area of said first deep well is S, the dielectric constant of said semiconductor substrate is ∈ si, the electric charge of the electrons is q, the impurity concentration of said semiconductor substrate is Nsub, the built-in potential is φbi, and the potential difference between said semiconductor substrate and said first deep well is Vapp, S satisfies the following formula:

$$S < \frac{1}{2} \cdot \frac{2\pi \cdot \left(\frac{X}{10}\right)}{\sqrt{\frac{\varepsilon\, si \cdot q \cdot Nsub}{2(\phi\, bi + Vapp)}}}.$$

11. The semiconductor device as defined in claim 1 wherein said first deep well isolates said wells constituting a PLL circuit with a clock frequency of X from said semiconductor substrate, and when the area of said first deep well is S, the dielectric constant of said semiconductor substrate is Åsi, the electric charge of the electrons is q, the impurity concentration of said semiconductor substrate is Nsub, the built-in potential is φbi, and the potential difference between said semiconductor substrate and said first deep well is Vapp, S satisfies the following formula:

$$S < \frac{1}{10} \cdot \frac{2\pi \cdot \left(\frac{X}{10}\right)}{\sqrt{\frac{\varepsilon\, si \cdot q \cdot Nsub}{2(\phi\, bi + Vapp)}}}.$$

* * * * *